United States Patent
Deng et al.

(10) Patent No.: US 7,741,923 B2
(45) Date of Patent: Jun. 22, 2010

(54) TRANSISTOR VOLTAGE-CONTROLLED OSCILLATOR AND FREQUENCY SYNTHESIZER HAVING THE SAME

(75) Inventors: Ping-Yuan Deng, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 47 days.

(21) Appl. No.: 12/048,574

(22) Filed: Mar. 14, 2008

(65) Prior Publication Data
US 2009/0140817 A1    Jun. 4, 2009

(30) Foreign Application Priority Data
Nov. 30, 2007   (TW) .............................. 96145522 A

(51) Int. Cl.
*H03B 5/08* (2006.01)
(52) U.S. Cl. .................... 331/167; 331/57; 331/172; 327/117
(58) Field of Classification Search ................ 331/167, 331/57, 172; 327/116
See application file for complete search history.

(56) References Cited

U.S. PATENT DOCUMENTS 7,102,454 B2 *   9/2006   Sze et al. ............... 331/117 FE
2005/0174184 A1 * 8/2005   Wu ........................... 331/176
2008/0007365 A1 * 1/2008   Venuti et al. ............... 331/179
2008/0197933 A1 * 8/2008   Zhang et al. ............... 331/179

* cited by examiner

*Primary Examiner*—Joseph Chang
*Assistant Examiner*—Jeffrey Shin
(74) *Attorney, Agent, or Firm*—Pearne & Gordon LLP

(57) ABSTRACT

A transistor voltage-controlled oscillator (VCO) and a frequency synthesizer having the transistor VCO are provided. The frequency synthesizer adopts a divide-by-five injection-locked frequency divider, which includes a five-stage inverter ring oscillating frequency dividing circuit for reducing the operating frequency of the oscillating signal from the VCO, thus decreasing power consumption due to counting operation of the frequency synthesizer. The transistor VCO includes three transistor switching capacitor sets connected in parallel to one another to form a parallel structure. The gates of the transistor switching capacitor sets are connected to respective operating voltage sources, so as to switch the status of the corresponding transistor switching capacitor set, which in turn adjusts the harmonic frequency generated by the VCO, thereby allowing the VCO to generate a corresponding operating frequency with enough bandwidth.

19 Claims, 10 Drawing Sheets

TRANSISTOR VOLTAGE-CONTROLLED OSCILLATOR AND FREQUENCY SYNTHESIZER HAVING THE SAME

FIELD OF THE INVENTION

The present invention relates to voltage-controlled oscillators (VCOs), and more particularly, to a transistor voltage-controlled oscillator and a frequency synthesizer having the transistor voltage-controlled oscillator.

BACKGROUND OF THE INVENTION

Referring to FIG. 1, a block diagram of a conventional phase-locked loop (PLL) frequency synthesizer is shown. The PLL frequency synthesizer includes a phase frequency detector (PFD), a charge pump, a loop filter, a voltage-controlled oscillator (VCO), a frequency divider and a reference signal.

In operation, an original signal with a frequency $f_o$ and a phase $\Theta_o(t)$ is output by the VCO. An operating signal with a frequency $f_d$ and a phase $\Theta_d(t)$ is generated by using the frequency divider to divide the original signal by an integer M. Then, the operating signal is input to the PFD and compared with the reference signal, which has a frequency $f_r$ and a phase $\Theta_r(t)$. Since the frequency divider is a divide-by-M frequency divider, $f_o = M * f_d$.

If the phase $\Theta_d(t)$ of the operating signal is equal to the phase $\Theta_r(t)$ of the reference signal, the PFD outputs two identical digital comparing signals UP and DN to the charge pump. The charge pump converts the digital comparing signals UP and DN into an analog current signal, which is input to the loop filter. The loop filter generates an operating voltage $V_c$ in accordance with the analog current signal and outputs the operating voltage $V_c$ to the VCO. The VCO regenerates the signal with the frequency $f_o$ and the phase $\Theta_o(t)$, thereby forming a feedback mechanism. This feedback mechanism allows the frequency $f_o$ of the original signal to be locked to M times of the frequency $f_r$ of the reference signal.

In order to accommodate applications in higher band WLAN, a pulse-swallow divider has been developed, which comprises a dual-modulus divide-by-N or divide-by-(N+1) prescaler and two variable dividers: one is a program counter (P counter), the other is a swallow counter (S counter), wherein the P counter is usually selected to have a counter capacity larger than that of the S counter.

The concept behind the pulse-swallow divider is as follows. Initially, the prescaler functions as a divide-by-(N+1) divider and divides the original signal by N+1, and inputs the divided original signal to the P and S counters simultaneously. Since the counter capacity of the P counter is larger than that of the S counter, the S counter will reach zero earlier than the P counter does. Upon reaching zero, the S counter sends a signal to the prescaler to change the prescaler to function as a divide-by-N divider, while the P counter keeps counting down to zero, when the whole operations will start over again. Thus, the total count in one complete cycle of the pulse-swallow divider is M=(N+1)S+N(P−S)=NP+S. In other words, the pulse-swallow divider functions as a divide-by-(NP+S) divider. By adjusting N, P and S appropriately, the pulse-swallow divider can divide a signal by any specified integer.

In the design of IEEE 802.11a WLAN frequency synthesizers, the above-mentioned pulse-swallow divider is often used. Referring to a research paper entitled "Study of 2 GHz and 5 GHz CMOS frequency synthesizers used in 802.11 WLAN" by Shin-Hong, Kuo in June 2004, it discloses the circuit design for a 16/17 pulse-swallow divider, which divides a 5 GHz operating frequency to 5 MHz. This allows the frequency of the reference signal to be selected down to 5 MHz. The corresponding M, N, P and S are listed in Table 1 below:

Corresponding M, N, S and P of a 5 GHz Frequency Synthesizer for Each Channel ($f_r$=5 MHz)

TABLE 1

|           | LO(MHz) | M    | N  | P  | S  |
|-----------|---------|------|----|----|----|
| Channel 1 | 5265    | 1053 | 16 | 63 | 45 |
| Channel 2 | 5285    | 1057 | 16 | 63 | 49 |
| Channel 3 | 5305    | 1061 | 16 | 63 | 53 |
| Channel 4 | 5325    | 1065 | 16 | 63 | 57 |

Referring to another publication entitled "802.11a WLAN CMOS frequency Synthesizer Design" by Lian-Yuen, Shao in November 2005, it also disclose a circuit design for a divider set, which includes a divide-by-two prescaler and a 16/17 pulse-swallow. A 5 GHz frequency is first divided by two to 2.5 GHz, and further divided by the 16/17 pulse-swallow divider to 10 MHz. This allows the frequency of the reference signal to be selected at 10 MHz steps. The corresponding M, N, P and S are listed in Table 2 below:

TABLE 2

Reference frequency 10 (MHz)
Lower band and middle U-NII bands

| LO (MHz) | LO/2 (MHz) | M Value | N Value | P Value 5 bit | S Value 4 bit |
|----------|------------|---------|---------|---------------|---------------|
| 5180 | 2590 | 259 | 16 | 16 | 3  |
| 5200 | 2600 | 260 | 16 | 16 | 4  |
| 5220 | 2610 | 261 | 16 | 16 | 5  |
| 5240 | 2620 | 262 | 16 | 16 | 6  |
| 5260 | 2630 | 263 | 16 | 16 | 7  |
| 5280 | 2640 | 264 | 16 | 16 | 8  |
| 5300 | 2650 | 265 | 16 | 16 | 9  |
| 5320 | 2660 | 266 | 16 | 16 | 10 |

However, since each counting operation of the S and P counters consumes some amount of energy. The more counts there are, the more energy will be consumed. In comparison of the above two examples, the former takes a larger number of counts than the latter, hence also consumes more energy.

Therefore, in the design of frequency divider, it is important to reduce energy consumption of the counters.

In addition, in order to satisfy the requirement of the IEEE 802.11a WLAN technology, the VCO built in an IEEE 802.11a WLAN high-band PLL frequency synthesizer must be capable of generating the corresponding frequency with enough bandwidth. As from the harmonic formula of an LC oscillating circuit, $$f_0 = \frac{1}{2\pi\sqrt{LC}},$$

the harmonic frequency output by the VCO depends on the overall capacitance and inductance of the VCO.

In summary, there is a need for a VCO that can generate a corresponding operating frequency with enough bandwidth.

In other words, there is a need for a VCO that can generate the required operating frequency by flexibly adjusting the capacitance.

SUMMARY OF THE INVENTION

In the light of forgoing drawbacks, an objective of the present invention is to provide a transistor VCO that generates a corresponding operating frequency with wide enough bandwidth.

Another objective of the present invention is to provide a frequency synthesizer to reduce power consumption due to counting operations of the frequency divider in the frequency synthesizer.

In accordance with the above and other objectives, the present invention provides a transistor voltage-controlled oscillator (VCO), including: a first transistor having a first gate, a first source and a first drain; a second transistor having a second gate, a second source and a second drain, the second drain being connected with the first gate, the second gate being connected to the first drain; a parallel capacitor switching circuit including a first transistor switching capacitor set, a second transistor switching capacitor set, a third transistor switching capacitor set, the three transistor switching capacitor sets forming a parallel structure, two ends of the parallel structure forming a first switching circuit node and a second switching circuit node, respectively; a first inductive circuit having a first inductive end connected with the first switching circuit node, and a second inductive end connected to ground; and a second inductive circuit having a third inductive end connected with the second switching circuit node, and a fourth inductive end connected to ground.

In one embodiment, the first transistor switching capacitor set includes: a third transistor having a third gate, a third source and a third drain; a first capacitor having a first capacitor end and a second capacitor end; a second capacitor having a third capacitor end and a fourth capacitor end; a first resistor having a first resistor end and a second resistor end; and a second resistor having a third resistor end and a fourth resistor end, wherein the first capacitor end is connected with the first switching circuit node, the second capacitor end is connected with the third source and the first resistor end, the third capacitor end is connected with the third drain and the third resistor end, the fourth capacitor end is connected with the second switching circuit node, and the second resistor end is connected to the fourth resistor end, forming a first operating node.

In one embodiment, the second transistor switching capacitor set includes: a fourth transistor having a fourth gate, a fourth source and a fourth drain; a third capacitor having a fifth capacitor end and a sixth capacitor end; a fourth capacitor having a seventh capacitor end and an eighth capacitor end; a third resistor having a fifth resistor end and a sixth resistor end; and a fourth resistor having a seventh resistor end and an eighth resistor end, wherein the fifth capacitor end is connected with the first switching circuit node, the sixth capacitor end is connected with the fourth source and the fifth resistor end, the seventh capacitor end is connected with the fourth drain and the seventh resistor end, the eighth capacitor end is connected with the second switching circuit node, and the sixth resistor end is connected to the eighth resistor end, forming a second operating node.

In one embodiment, the third transistor switching capacitor set includes: a fifth transistor with a fifth gate, a fifth source and a fifth drain; a fifth capacitor with a ninth capacitor end and a tenth capacitor end; a sixth capacitor with an eleventh capacitor end and a twelfth capacitor end; a fifth resistor with a ninth resistor end and a tenth resistor end; and a sixth resistor with an eleventh resistor end and a twelfth resistor end, wherein the ninth capacitor end is connected with the first switching circuit node, the tenth capacitor end is connected with the fifth source and the ninth resistor end, the eleventh capacitor end is connected with the fifth drain and the eleventh resistor end, the twelfth capacitor end is connected with the second switching circuit node, and the tenth resistor end is connected to the twelfth resistor end, forming a third operating node.

The third gate and the first operating node are connected to a first operating voltage source for adjusting the operating status of the third transistor. The fourth gate and the second operating node are connected to a second operating voltage source for adjusting the operating status of the fourth transistor. The fifth gate and the third operating node are connected to a third operating voltage source for adjusting the operating status of the fifth transistor.

Moreover, the parallel capacitor switching circuit is further connected in parallel to a blocking variable capacitor set. The blocking variable capacitor set fine tunes the operating frequency of the transistor VCO and switches the parallel capacitor switching circuit to operate either in an accumulation mode or in a depletion mode.

The present invention further provides a frequency synthesizer, including: a reference signal source for providing a reference signal; the above-mentioned VCO for generating an oscillating signal and a first analog signal identical to the oscillating signal; an injection-locked frequency divider including a five-stage inverter ring oscillating frequency dividing circuit, the five-stage inverter ring oscillating frequency dividing circuit receives the first analog signal from the VOC and divides the frequency of the first analog signal by five, to generate a first frequency-divided signal; a pulse-swallow frequency divider for receiving the first frequency-divided signal and generating a second frequency-divided signal; a phase frequency detector (PFD) for receiving the second frequency-divided signal and comparing the second frequency-divided signal with the reference signal, to output two digital signals; a charge pump for receiving and comparing the two digital signals sent by the PFD to output a second analog signal; and a loop filter for receiving the second analog signal and generating a third analog signal to the VCO.

In summary, compared with the prior art, the present invention provides a frequency synthesizer having a transistor VCO, which adopts a divide-by-five injection-locked frequency divider. The injection-locked frequency divider includes a five-stage inverter ring oscillating frequency dividing circuit for reducing the operating frequency of the oscillating signal, thus decreasing power consumption due to counting operations of the PLL frequency synthesizer. The transistor VCO includes three transistor switching capacitor sets connected in parallel to one another to form a parallel structure. The transistor gates of the three transistor switching capacitor sets are connected to respective operating voltage sources, so as to switch the status of the corresponding transistor switching capacitor set, which adjusts the harmonic frequency generated by the VCO, thereby allowing the VCO to generate a corresponding operating frequency with wide enough bandwidth.

BRIEF DESCRIPTION OF THE DRAWINGS

The present invention can be more fully understood by reading the following detailed description of the preferred embodiments, with reference made to the accompanying drawings, wherein.

Figure 1:
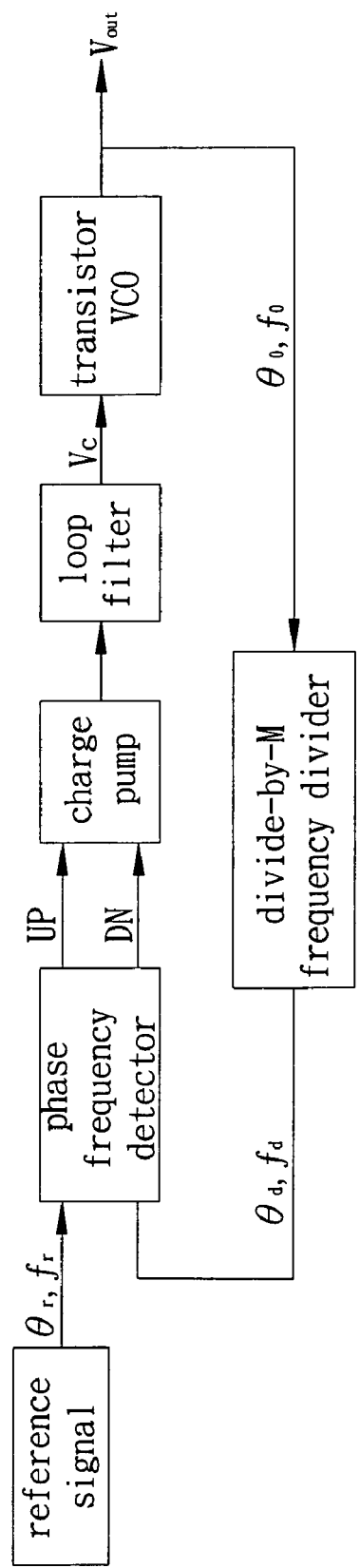
FIG. 1 is a block diagram of a conventional phase-locked loop (PLL) frequency synthesizer.
Figure 2A:
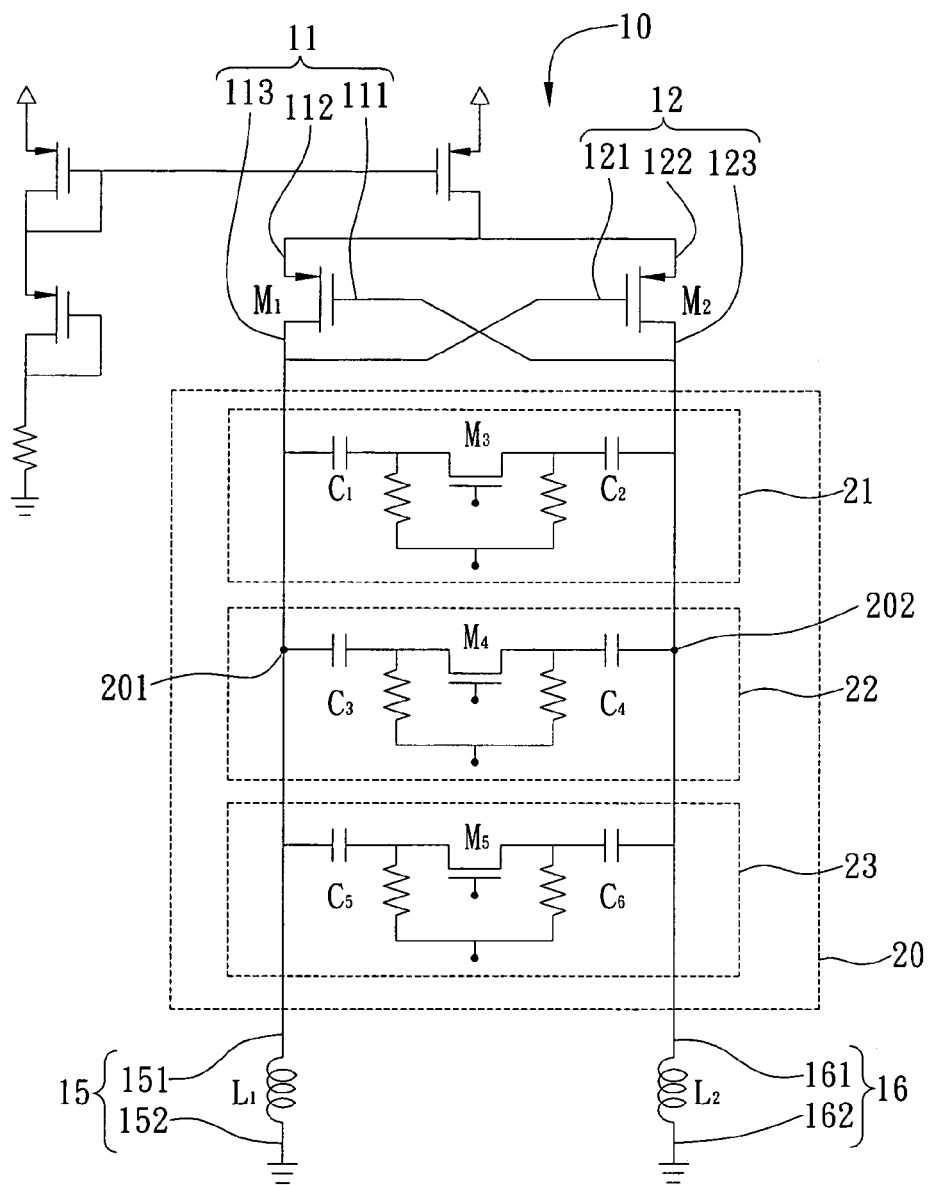
FIG. 2*a* is a circuit diagram of the transistor voltage-controlled oscillator (VCO) of the present invention.
Figure 2B:
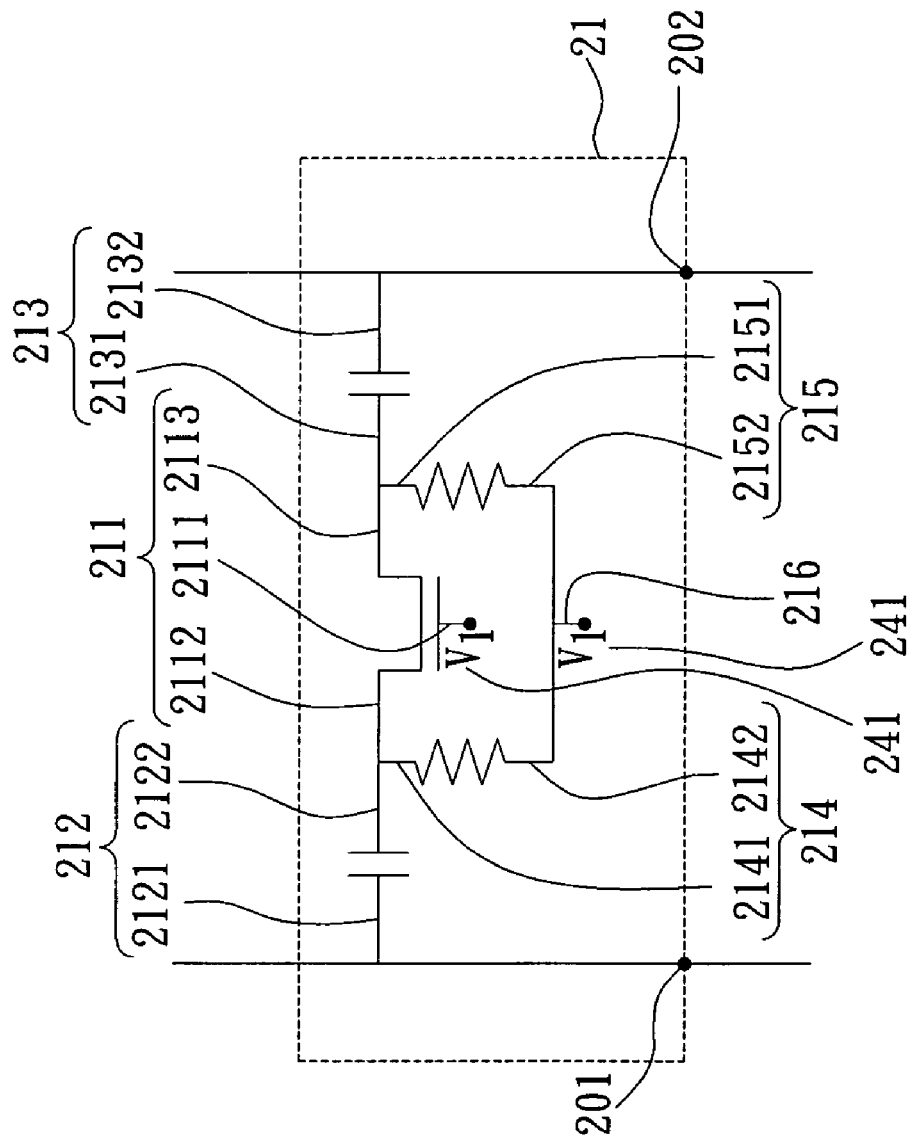
FIGS. 2*b* to 2*d* are circuit diagrams of three transistor switching capacitor sets in the transistor VCO of the present invention.
Figure 2C:
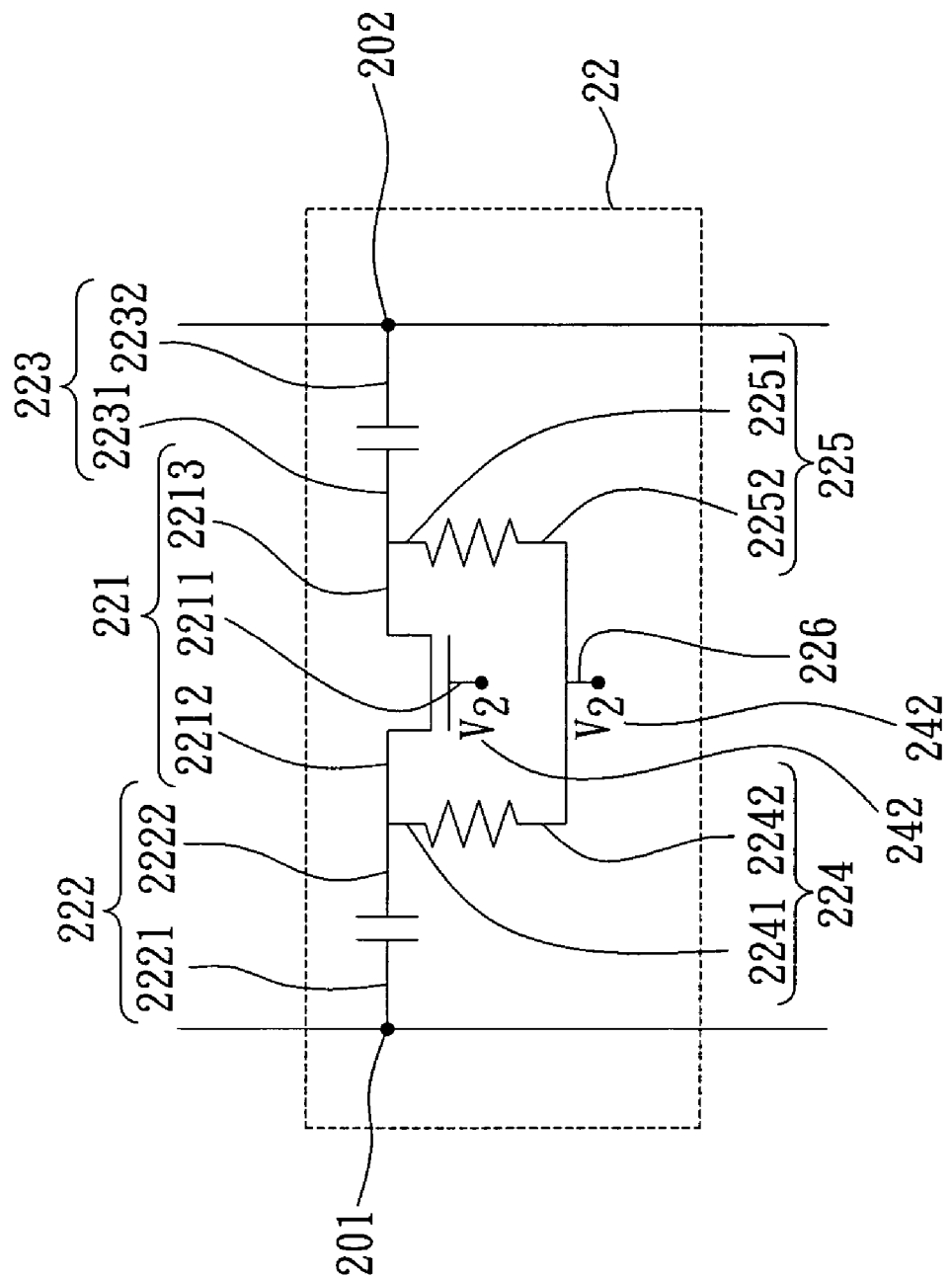
Figure 2D:
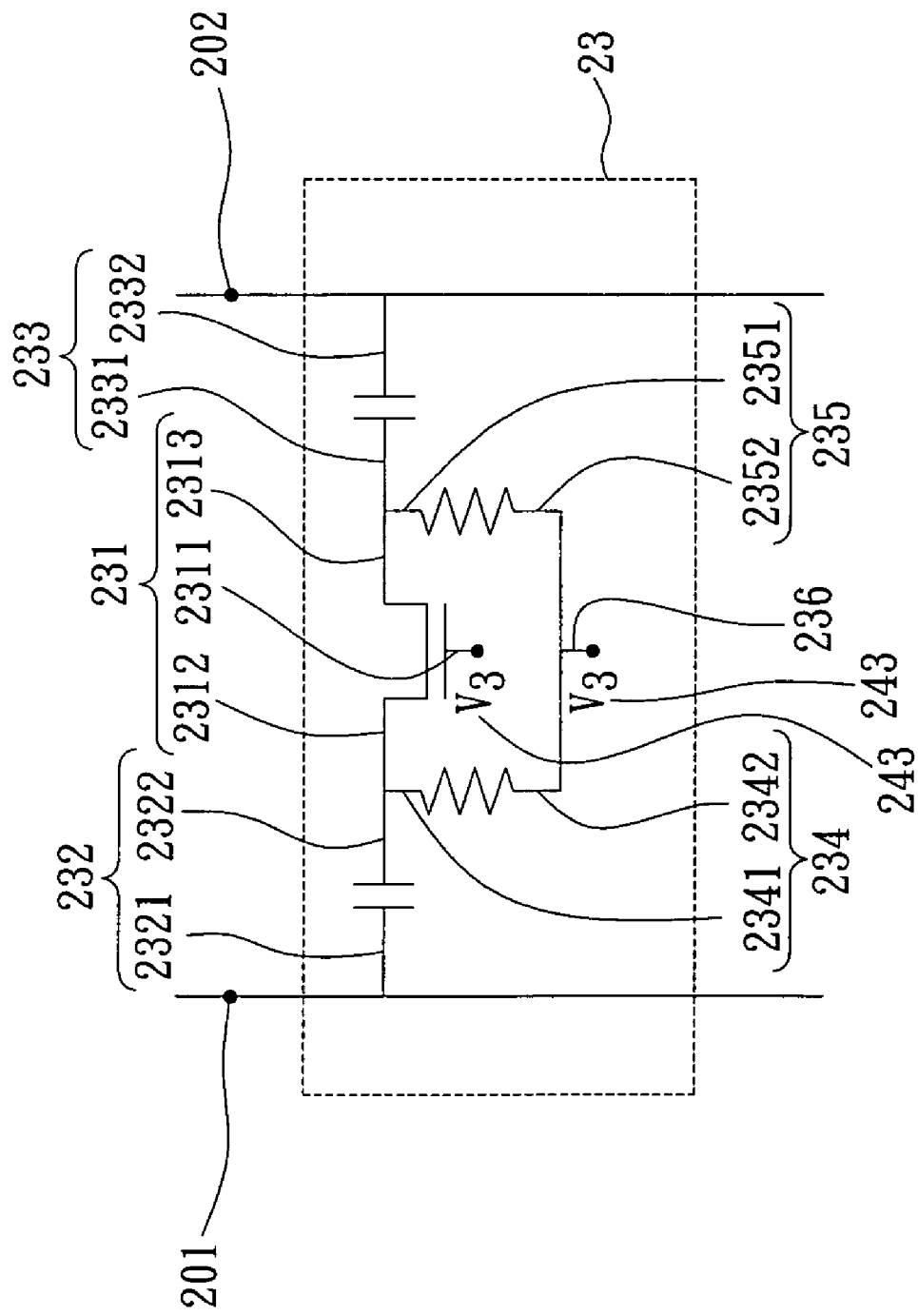
Figure 3:
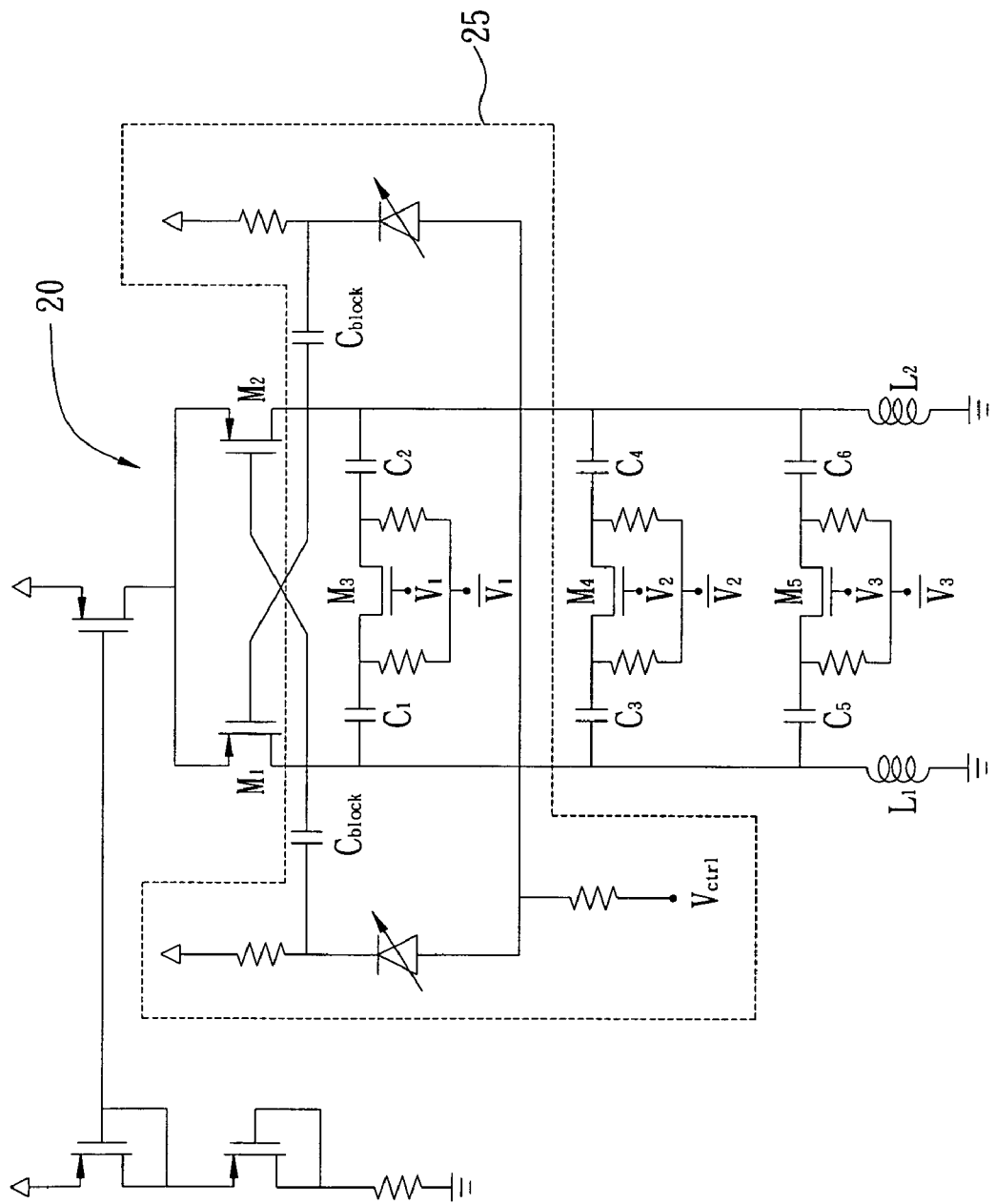

(The control voltages in FIGS. 2*b* to 2*d* are different from that in FIG. 3, there should be an upper bar for the control voltage connected to the resistor ends)

Figure 4:
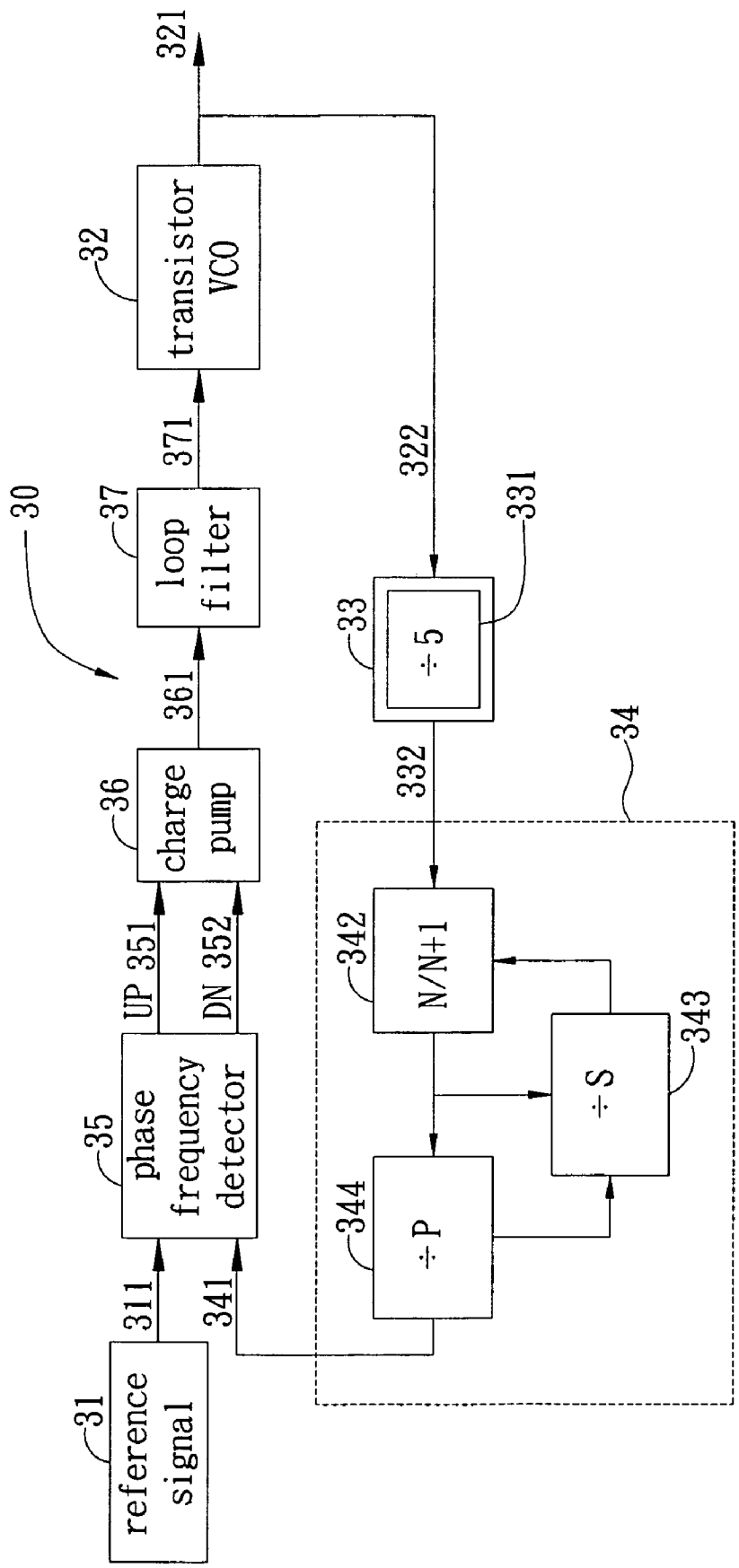
Figure 5:
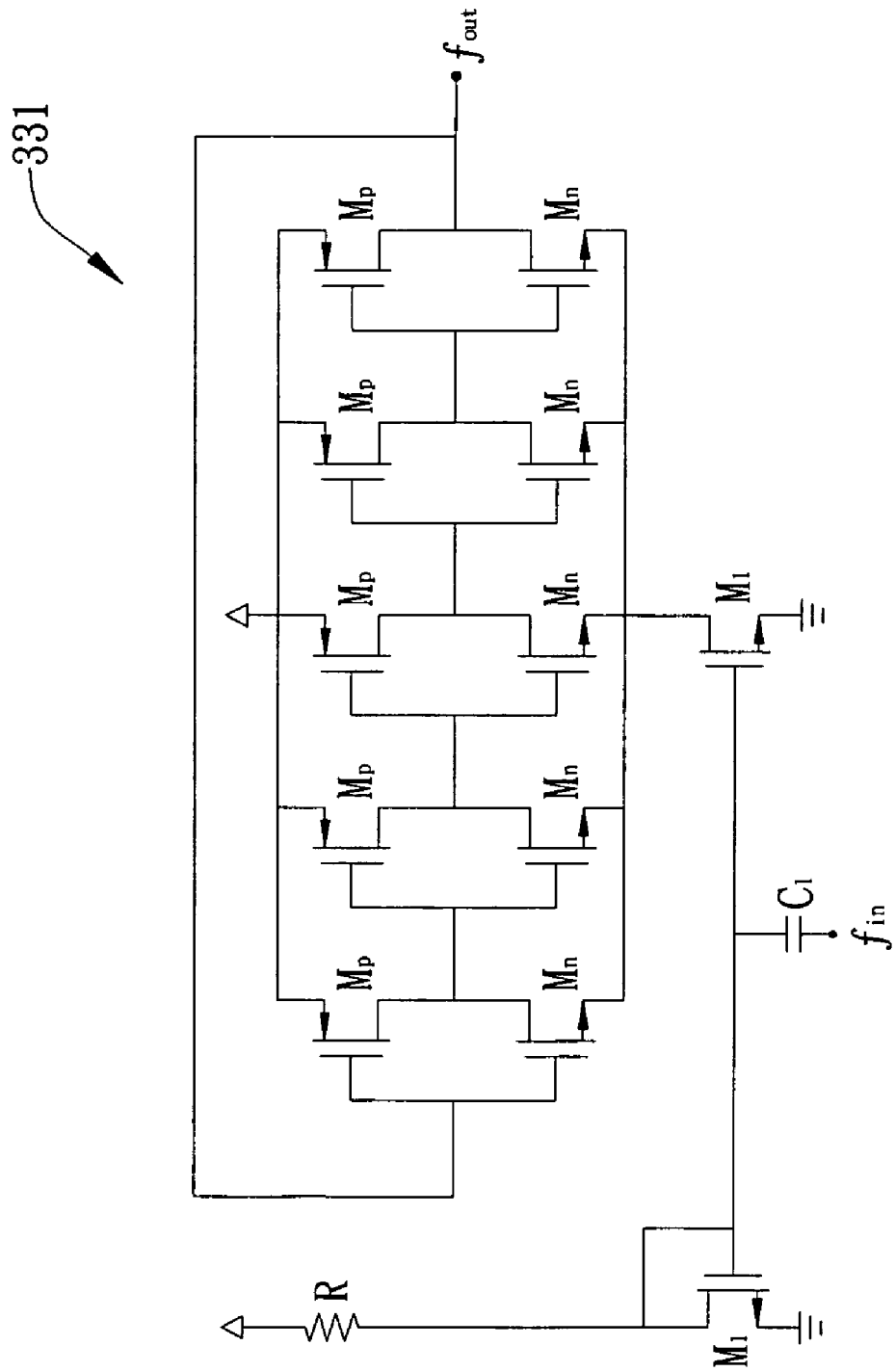
Figure 6:
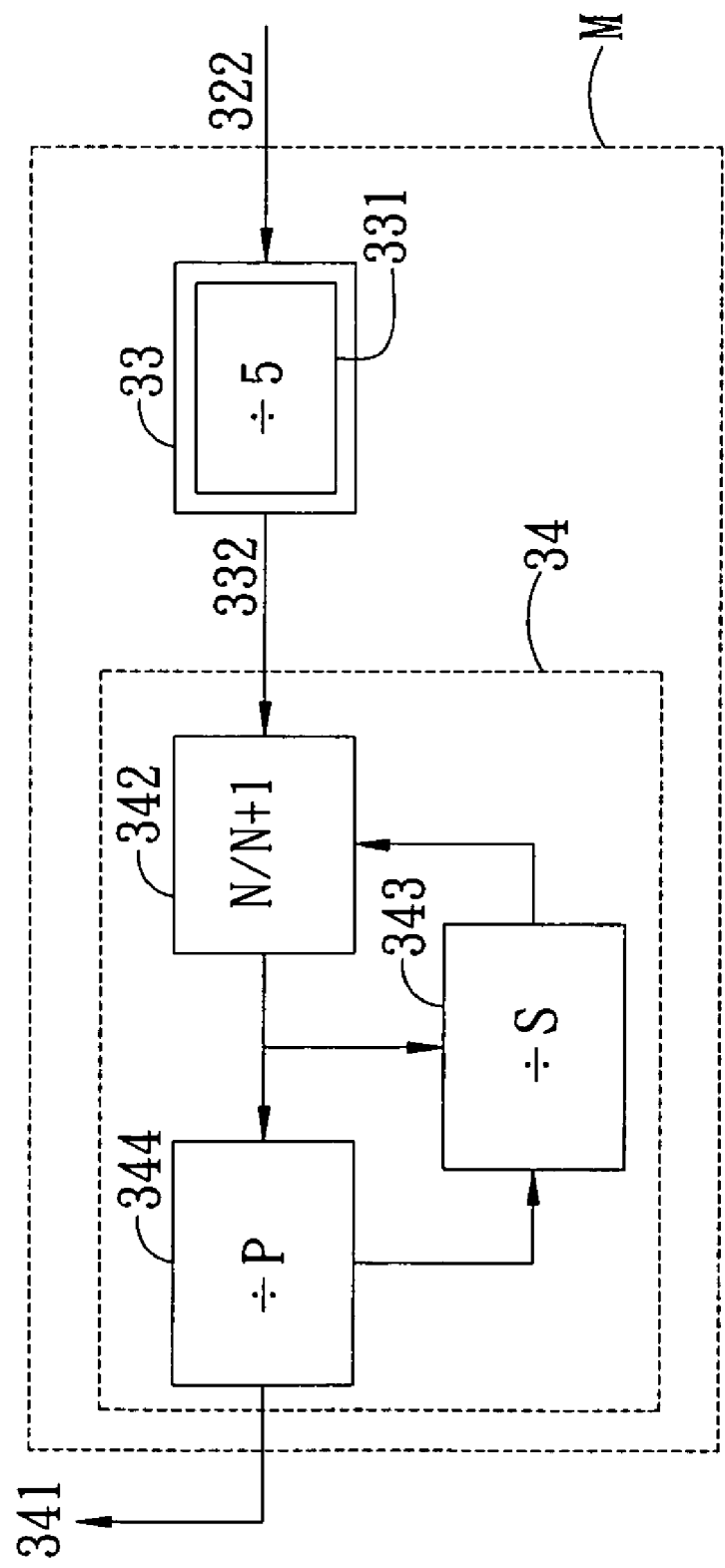
Figure 7:
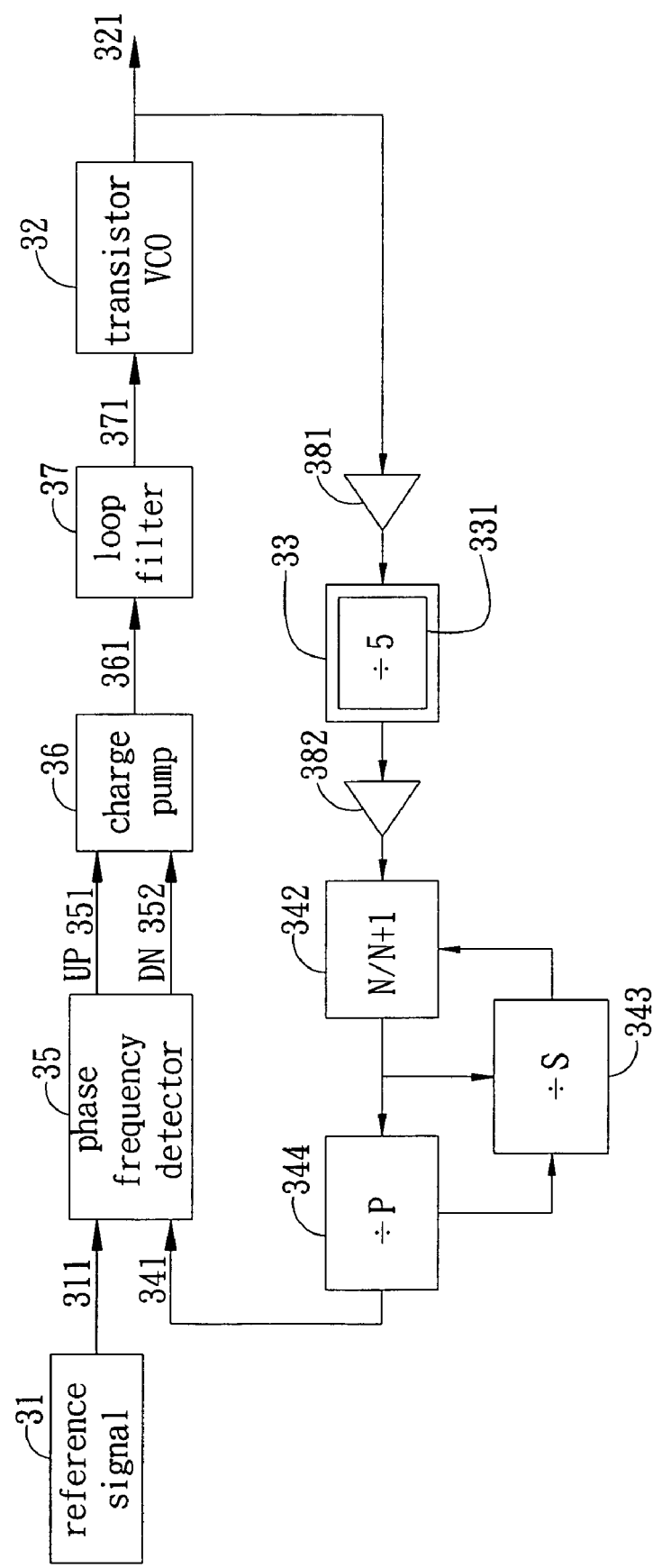

FIG. 3 is a circuit diagram of a transistor VCO according to a second embodiment of the present invention;

FIG. 4 is a block diagram of a frequency synthesizer embedding the transistor VCO of the present invention;

FIG. 5 is a circuit diagram of a traditional five-stage inverter ring oscillating frequency dividing circuit;

FIG. 6 is the overall frequency division scheme of the frequency synthesizer of the present invention; and FIG. 7 is a block diagram of a frequency synthesizer having the transistor VCO according to a fourth embodiment of the present invention.

DETAILED DESCRIPTION OF THE EMBODIMENTS

The present invention is described by the following specific embodiments. Those with ordinary skills in the art can readily understand the other advantages and functions of the present invention after reading the disclosure of this specification. The present invention can also be implemented with different embodiments. Various details described in this specification can be modified based on different viewpoints and applications without departing from the scope of the present invention.

First Embodiment

Referring to FIG. 2*a*, a circuit diagram of a transistor voltage-controlled oscillator (VCO) 10 of the present invention is shown. The transistor VCO 10 comprises a first transistor 11 having a first gate 111, a first source 112 and a first drain 113; a second transistor 12 having a second source 122, a second gate 121 connected to the first drain 113, and a second drain 123 connected with the first gate 111; a parallel capacitor switching circuit 20 including a first transistor switching capacitor set 21, a second transistor switching capacitor set 22 a third transistor switching capacitor set 23 connected in parallel to one another to form a parallel structure, two ends of the parallel structure forming a first switching circuit node 201 and a second switching circuit node 202, respectively; a first inductive circuit 15 having a first inductive end 151 connected to the first switching circuit node 201, and a second inductive end 152 connected to ground; a second inductive circuit 16 having a third inductive end 161 connected to the second switching circuit node 202, and a fourth inductive end 162 connected to ground.

Referring to FIG. 2*b*, a circuit diagram of the first transistor switching capacitor set 21 is shown. The switching capacitor set 21 includes a third transistor 211, a first capacitor 212, a second capacitor 213, a first resistor 214, and a second resistor 215. The third transistor 211 has a third gate 2111, a third source 2112 and a third drain 2113. The first capacitor 212 has a first capacitor end 2121 and a second capacitor end 2122. The second capacitor 213 has a third capacitor end 2131 and a fourth capacitor end 2132. The first resistor 214 has a first resistor end 2141 and a second resistor end 2142. The second resistor 215 has a third resistor end 2151 and a fourth resistor end 2152. The first capacitor end 2121 is connected with the first switching circuit node 201. The second capacitor end 2122 is connected with the third source 2112 and the first resistor end 2141. The third capacitor end 2131 is connected with the third drain 2113 and the third resistor end 2151. The fourth capacitor end 2132 is connected with the second switching circuit node 202. The second resistor end 2142 is connected to the fourth resistor end 2152, forming a first operating node 216.

Referring to FIG. 2*c*, a circuit diagram of the second transistor switching capacitor set 22 is shown. The second switching capacitor set 22 includes a fourth transistor 221, a third capacitor 222, a fourth capacitor 223, a third resistor 224, and a fourth resistor 225. The fourth transistor 221 has a fourth gate 2211, a fourth source 2212 and a fourth drain 2213. The third capacitor 222 has a fifth capacitor end 2221 and a sixth capacitor end 2222. The fourth capacitor 223 has a seventh capacitor end 2231 and an eighth capacitor end 2232. The third resistor 224 has a fifth resistor end 2241 and a sixth resistor end 2242. The fourth resistor 225 has a seventh resistor end 2251 and an eighth resistor end 2252. The fifth capacitor end 2221 is connected with the first switching circuit node 201. The sixth capacitor end 2222 is connected with the fourth source 2212 and the fifth resistor end 2241. The seventh capacitor end 2231 is connected with the fourth drain 2213 and the seventh resistor end 2251. The eighth capacitor end 2232 is connected with the second switching circuit node 202. The sixth resistor end 2242 is connected to the eighth resistor end 2252, forming a second operating node 226.

Referring to FIG. 2*d*, a circuit diagram of the third transistor switching capacitor set 23 is shown. The third switching capacitor set 23 includes a fifth transistor 231, a fifth capacitor 232, a sixth capacitor 233, a fifth resistor 234, and a sixth resistor 235. The fifth transistor 231 has a fifth gate 2311, a fifth source 2312 and a fifth drain 2313. The fifth capacitor 232 has a ninth capacitor end 2321 and a tenth capacitor end 2322. The sixth capacitor 233 has an eleventh capacitor end 2331 and a twelfth capacitor end 2332. The fifth resistor 234 has a ninth resistor end 2341 and a tenth resistor end 2342. The sixth resistor 235 has an eleventh resistor end 2351 and a twelfth resistor end 2352. The ninth capacitor end 2321 is connected with the first switching circuit node 201. The tenth capacitor end 2322 is connected with the fifth source 2312 and the ninth resistor end 2341. The eleventh capacitor end 2331 is connected with the fifth drain 2313 and the eleventh resistor end 2351. The twelfth capacitor end 2332 is connected with the second switching circuit node 202. The tenth resistor end 2342 is connected to the twelfth resistor end 2352, forming a third operating node 236.

The third gate 2111 and the first operating node 216 are connected to a first operating voltage source 241 for adjusting the operating status of the third transistor 211. The fourth gate 2211 and the second operating node 226 are connected to a second operating voltage source 242 for adjusting the operating status of the fourth transistor 221. The fifth gate 2311 and the third operating node 236 are connected to a third operating voltage source 243 for adjusting the operating status of the fifth transistor 231.

Second Embodiment

Referring to FIG. 3, a circuit diagram of a transistor VCO according to a second embodiment of the present invention is shown. The second embodiment differs from the first embodiment in that the parallel capacitor switching circuit 20 is further connected in parallel to a blocking variable capacitor set 25. The blocking variable capacitor set 25 fine tunes the operating frequency of the transistor VCO 10, and switches the parallel capacitor switching circuit 20 to operate either in an accumulation mode or in a depletion mode.

Third Embodiment

Referring to FIG. 4, a block diagram of a frequency synthesizer 30 having the transistor VCO of the present invention is shown. The frequency synthesizer 30 comprises a reference signal source 31 for providing a reference signal 311; a VCO 32, which is for example the one disclosed in the first or second embodiment, for generating an oscillating signal 321 and a first analog signal 322 identical to the oscillating signal 321; an injection-locked frequency divider 33 including a five-stage inverter ring oscillating frequency dividing circuit 331, which receives the first analog signal 322 from the VCO 32 and divides the frequency of the first analog signal 322 by five, to generate a first frequency-divided signal 332; a pulse-swallow frequency divider 34 for receiving the first frequency-divided signal 332 and generating a second frequency-divided signal 341; a PFD 35 for receiving the second frequency-divided signal 341 and comparing the second frequency-divided signal 341 with the reference signal 311, to output an UP digital signal 351 and a DN digital signal 352; a charge pump 36 for receiving and comparing the UP digital signal 351 and the DN digital signal 352 sent by the PFD 35 and outputting a second analog signal 361; and a loop filter 37 for receiving the second analog signal 361 and generating a third analog signal 371 to the VCO 32.

The frequency synthesizer 30 having the transistor VCO 32 of the present invention and the conventional frequency synthesizer operate similarly. The oscillating signal 321, which has a frequency $f_o$ and a phase $\Theta_o(t)$, is output by the VCO 32. The second frequency-divided signal 341, which has a frequency $f_d$ and a phase $\Theta_d(t)$, is generated from dividing the oscillating signal 321 using a divide-by-M frequency divider. Then, the operating signal is input to the PFD 35 and compared with the reference signal, which has a frequency $f_r$ and a phase $\Theta_r(t)$.

Upon comparing the phase $\Theta_d(t)$ of the the second frequency-divided signal and the phase $\Theta_r(t)$ of the reference signal 311, the PFD 35 outputs two digital signals UP and DN to the charge pump 36, which then compares the two digital signals UP and DN and converts the compared result into the second analog signal 361. The second analog signal 361 is then input to the loop filter 37 to obtain the third analog signal 371, which is to be sent to the VCO 32. The VCO regenerates the oscillating signal 321, which has the frequency $f_o$ and the phase $\Theta_o(t)$, and the first analog signal 322 equal to the oscillating signal 321. The first analog signal 322 is fedback to form a feedback mechanism. The feedback mechanism allows the frequency $f_o$ of the original signal to be locked at M times the frequency $f_r$ of the reference signal.

However, as mentioned before, since each counting operation of the S and P counters consumes some energy. More counts will consume more energy. The present invention is characterized by the addition of a divide-by-five injection-locked frequency divider 33 which includes a five-stage inverter ring oscillating frequency dividing circuit 331.

Referring to FIG. 5, a circuit diagram of a conventional five-stage inverter ring oscillating frequency dividing circuit 331 is shown. The injection-locked frequency divider 33 receives the first analog signal 322 and divides the frequency of the first analog signal 322 by five to generate the first frequency-divided signal 332, such that the signal frequency of the first analog signal 322 is five times the frequency of the first frequency-divided signal 332. In addition, a five-stage ring oscillator is selected due to the fact that the Q factor of the ring oscillator is smaller than the LC oscillator. Thus, it provides a greater frequency-dividing range than an LC-tank oscillator of the same order.

Referring to Table 3 below, exemplary parameters of the frequency synthesizer 30 of the present invention are shown.

TABLE 3

| | $F_{out}$ (MHz) | M | N | P | S |
|---|---|---|---|---|---|
| Channel 1 | 5180 | 1295 | 16 | 16 | 3 |
| Channel 2 | 5200 | 1300 | 16 | 16 | 4 |
| . | . | . | 16 | 16 | . |
| . | . | . | | | . |
| . | . | . | | | . |
| Channel 7 | 5300 | 1325 | 16 | 16 | 9 |
| Channel 8 | 5320 | 1330 | 16 | 16 | 10 |

In this example, as shown in $F_{out}$ of Table 3, the VCO 32 of the frequency synthesizer 30 of the present invention is able to lock eight sets of oscillating signals having frequencies: 5180 MHz, 5200 MHz, 5220 MHz, 5240 MHz, 5260 MHz, 5280 MHz, 5300 MHz, and 5300 MHz, respectively.

Referring to FIG. 6, the overall frequency division scheme of the frequency synthesizer 30 of the present invention is shown. First, the frequency of an oscillating signal 321 is selected from the set of frequencies: 5180 MHz, 5200 MHz, 5220 MHz, 5240 MHz, 5260 MHz, 5280 MHz, 5300 MHz, and 5300 MHz, which is then output by the VCO 32 to the injection-locked frequency divider 33. The frequency of the oscillating signal is divided by five by the injection-locked frequency divider 33 to obtain a first frequency-divided signal 332, which is then sent to the pulse-swallow frequency divider 34.

The pulse-swallow frequency divider 34 contains an N/N+1 dual-modulus prescaler 342 with N=16, that is, the first mode of the N/N+1 dual-modulus prescaler 342 is a divide-by-sixteen frequency divider, while the second mode is a divide-by-seventeen frequency divider. The pulse-swallow frequency divider 34 further includes a first variable counter 343 and a second variable counter 344, wherein the first variable counter 343 has four bits to represent the S value in Table 3, while the second variable counter 344 has five bits to represent the P value in Table 3, which is set to be 16 in this embodiment.

As shown in Table 3 and in conjunction with the operational principle of the pulse-swallow frequency divider, it can be deduced that the total counts in one complete counting cycle provided by the pulse-swallow frequency divider is (N+1)S+N(P−S)=NP+S; with the addition of the divide-by-five injection-locked frequency divider 33, the overall frequency divisor of the frequency synthesizer of this embodiment is M=5(NP+S).

In this way, the pulse-swallow frequency divider 34 is allowed to operate under a lower frequency, hence reducing power loss due to the counting operations of the frequency divider. Moreover, the second frequency-divided oscillating signal 341 may be reduced to 4 MHz, implying that the frequency of the reference signal required is only 4 MHz. This enables the use of a simple quartz oscillating module as the reference signal source, greatly improving the convenience of the design.

Fourth Embodiment

Referring to FIG. 7, a block diagram of a frequency synthesizer having the transistor VCO according to a fourth embodiment of the present invention is shown. This embodiment differs from the third embodiment in that it further includes a first buffer amplifier 381 and a second buffer amplifier 382 for amplifying the first analog signal 322 and the first frequency-divided signal 332, respectively. The purpose for this is that the dc level of the signal output from the VCO to the frequency divider is usually offset, and the amplitude of which is not a full swing. Thus, before sent to the frequency divider, signal is pre-amplified in order to increase its amplitude and adjust its dc level.

It should be noted that the number of buffer amplifiers can be adjusted as needed in other embodiments of the present invention.

In summary, the present invention provides a frequency synthesizer having a transistor VCO, which adopts a divide-by-five injection-locked frequency divider. The injection-locked frequency divider includes a five-stage inverter ring oscillating frequency dividing circuit for reducing the operating frequency of the oscillating signal, thus decreasing the power consumption due to counting operation of the PLL frequency synthesizer. The transistor VCO includes three transistor switching capacitor sets connected in parallel to form a parallel structure. The transistor gate of each transistor switching capacitor set is connected to a respective operating voltage source, so as to switch the status of the corresponding transistor switching capacitor set, which adjusts the harmonic frequency of the VCO, thereby allowing the VCO to provide a corresponding operating frequency with wide enough bandwidth.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A frequency synthesizer, comprising:
a reference signal source for providing a reference signal;
a voltage-controller oscillator (VCO) for generating an oscillating signal and a first analog signal identical to the oscillating signal;
an injection-locked frequency divider including a five-stage inverter ring oscillating frequency dividing circuit, the five-stage inverter ring oscillating frequency dividing circuit receives the first analog signal from the VCO and divides the frequency of the first analog signal by five, to generate a first frequency-divided signal;
a pulse-swallow frequency divider for receiving the first frequency-divided signal and generating a second frequency-divided signal;
a phase frequency detector (PFD) for receiving the second frequency-divided signal and comparing the second frequency-divided signal with the reference signal to output two digital signals;
a charge pump for receiving and comparing the two digital signals sent by the PFD to output a second analog signal; and
a loop filter for receiving the second analog signal and generating a third analog signal to the VCO.

2. The frequency synthesizer of claim 1, wherein the reference signal source is a quartz oscillation module.

3. The frequency synthesizer of claim 2, wherein the reference signal output by the quartz oscillation module has a frequency equal to 4 MHz.

4. The frequency synthesizer of claim 1, further comprising at least two buffer amplifiers for amplifying the first analog signal and the first frequency-divided signal, respectively.

5. The frequency synthesizer of claim 1, wherein the injection-locked frequency divider is a divide-by-five frequency divider.

6. The frequency synthesizer of claim 1, wherein the pulse-swallow frequency divider includes an N/N+1 dual-modulus prescaler, a first variable counter and a second variable counter.

7. The frequency synthesizer of claim 6, wherein N=16, a first mode of the dual-modulus prescaler is a divide-by-16 frequency divider, while a second mode of the dual-modulus prescaler is a divide-by-17 frequency divider.

8. The frequency synthesizer of claim 6, wherein the first variable counter is a swallow counter with four bits, and the second variable counter is a program counter with five bits.

9. The frequency synthesizer of claim 1, wherein the frequency synthesizer is compatible to IEEE 802.11 protocol, and locks eight sets of oscillating signals with frequencies of 5180 MHz, 5200 MHz, 5220 MHz, 5240 MHz, 5260 MHz, 5280 MHz, 5300 MHz, and 5300 MHz, respectively.

10. The frequency synthesizer of claim 1, wherein the VCO comprises
a first transistor having a first gate, a first source and a first drain;
a second transistor having a second source, a second gate connected to the first drain, and a second drain connected to the first gate;
a parallel capacitor switching circuit including a first transistor switching capacitor set, a second transistor switching capacitor set and a third transistor switching capacitor set connected in parallel to one another to form a parallel structure, two ends of the parallel structure forming a first switching circuit node and a second switching circuit node, respectively;
a first inductive circuit having a first inductive end connected to the first switching circuit node, and a second inductive end connected to ground; and
a second inductive circuit having a third inductive end connected to the second switching circuit node, and a fourth inductive end connected to ground.

11. The frequency synthesizer of claim 10, wherein the first transistor switching capacitor set comprises:
a third transistor having a third gate, a third source and a third drain;
a first capacitor having a first capacitor end connected with the first switching circuit node, and a second capacitor end connected with the third source and the first resistor end;
a second capacitor having a third capacitor end connected with the third drain and the third resistor end, and a fourth capacitor end connected with the second switching circuit node;
a first resistor having a first resistor end and a second resistor end; and
a second resistor having a third resistor end and a fourth resistor end connected to the second resistor end, forming a first operating node.

12. The frequency synthesizer of claim 11, wherein the third gate and the first operating node are connected to a first operating voltage source for adjusting the operating status of the third transistor.

13. The frequency synthesizer of claim 10, wherein the second transistor switching capacitor set comprises:
a fourth transistor having a fourth gate, a fourth source and a fourth drain;

a third capacitor having a fifth capacitor end and a sixth capacitor end;

a fourth capacitor having a seventh capacitor end and an eighth capacitor end;

a third resistor having a fifth resistor end and a sixth resistor end; and a fourth resistor having a seventh resistor end and an eighth resistor end, wherein the fifth capacitor end is connected with the first switching circuit node, the sixth capacitor end is connected with the fourth source and the fifth resistor end, the seventh capacitor end is connected with the fourth drain and the seventh resistor end, the eighth capacitor end is connected with the second switching circuit node, and the sixth resistor end is connected to the eighth resistor end, forming a second operating node.

14. The frequency synthesizer of claim 13, wherein the fourth gate and the second operating node are connected to a second operating voltage source for adjusting the operating status of the fourth transistor.

15. The frequency synthesizer of claim 10, wherein the third transistor switching capacitor set comprises:

a fifth transistor having a fifth gate, a fifth source and a fifth drain;

a fifth capacitor having a ninth capacitor end and a tenth capacitor end;

a sixth capacitor having an eleventh capacitor end and a twelfth capacitor end;

a fifth resistor having a ninth resistor end and a tenth resistor end; and a sixth resistor having an eleventh resistor end and a twelfth resistor end, wherein the ninth capacitor end is connected with the first switching circuit node, the tenth capacitor end is connected with the fifth source and the ninth resistor end, the eleventh capacitor end is connected with the fifth drain and the eleventh resistor end, the twelfth capacitor end is connected with the second switching circuit node, and the tenth resistor end is connected to the twelfth resistor end, forming a third operating node.

16. The frequency synthesizer of claim 15, wherein the fifth gate and the third operating node are connected to a third operating voltage source for adjusting the operating status of the fifth transistor.

17. The frequency synthesizer of claim 10, wherein the first source and the second source are connected to a supply voltage source.

18. The frequency synthesizer of claim 10, wherein the VCO further comprises a blocking variable capacitor set connected in parallel to the parallel capacitor switching circuit, the blocking variable capacitor set fine tunes the operating frequency of the transistor VCO, and switches the parallel capacitor switching circuit to operate either in an accumulation mode or in a depletion mode.

19. The frequency synthesizer of claim 10, wherein the transistor VCO is a PMOS transistor VCO.

* * * * *